US010050620B2

United States Patent
Sato et al.

(10) Patent No.: US 10,050,620 B2
(45) Date of Patent: Aug. 14, 2018

(54) CASCODE CONNECTED SIC-JFET WITH SIC-SBD AND ENHANCEMENT DEVICE

(71) Applicant: Renesas Electronics America Inc., Santa Clara, CA (US)

(72) Inventors: Tetsuo Sato, San Jose, CA (US); Koichi Yamazaki, Maebashi (JP)

(73) Assignee: RENESAS ELECTRONICS AMERICA INC., Milpitas, CA (US)

( * ) Notice: Subject to any disclaimer, the term of this patent is extended or adjusted under 35 U.S.C. 154(b) by 67 days.

(21) Appl. No.: 14/634,195

(22) Filed: Feb. 27, 2015

(65) Prior Publication Data

US 2016/0254808 A1   Sep. 1, 2016

(51) Int. Cl.
| H02M 3/155 | (2006.01) |
| H03K 17/687 | (2006.01) |
| H03K 17/567 | (2006.01) |
| H03K 17/74 | (2006.01) |
| H03K 17/0416 | (2006.01) |
| H02M 7/00 | (2006.01) |

(52) U.S. Cl.
CPC ... *H03K 17/6871* (2013.01); *H03K 17/04163* (2013.01); *H03K 17/567* (2013.01); *H03K 17/74* (2013.01); *H02M 7/003* (2013.01); *Y02B 70/1483* (2013.01)

(58) Field of Classification Search
CPC ...... H02M 3/158; H02M 3/156; H02M 3/155; H02M 3/157
USPC .......................... 323/271, 282, 283, 284, 351
See application file for complete search history.

(56) References Cited

U.S. PATENT DOCUMENTS

| 5,959,372 | A | * | 9/1999 | Every | G08C 19/02 307/131 |
| 8,502,282 | B2 | | 8/2013 | Sankin et al. | 257/265 |
| 9,123,536 | B2 | * | 9/2015 | Ikeda | H01L 27/0266 |
| 9,142,544 | B2 | * | 9/2015 | Ikeda | H01L 27/0255 |
| 9,559,608 | B2 | * | 1/2017 | Glenn | H02M 7/217 |
| 2003/0227280 | A1 | * | 12/2003 | Vinciarelli | H02M 1/088 323/265 |
| 2006/0113593 | A1 | * | 6/2006 | Sankin | H01L 27/098 257/341 |
| 2007/0170897 | A1 | * | 7/2007 | Williams | H02M 3/155 323/222 |
| 2008/0048806 | A1 | * | 2/2008 | Maier | H03K 17/08148 335/7 |
| 2008/0191216 | A1 | * | 8/2008 | Machida | H01L 25/18 257/76 |
| 2009/0135636 | A1 | * | 5/2009 | Kuzumaki | H02M 1/096 363/132 |

(Continued)

OTHER PUBLICATIONS

Friedrichs, Peter et al.; "SiC Power Devices with Low On-Resistance for Fast Switching Applications"; Siemens AG, Corporate Research and Development; ISPSO 2000, May 22-25, Toulouse France; pp. 213-216.

*Primary Examiner* — Adolf Berhane
(74) *Attorney, Agent, or Firm* — Foley & Lardner LLP

(57) ABSTRACT

An apparatus that includes a first device connected to an inductor. The first device includes a first silicon carbide (SiC) junction gate field-effect transistor (JFET), a first SiC schottky barrier diode (SBD) connected to a gate and a drain of the first SiC JFET, and a first silicon (Si) transistor connected to transmit current to a source of the first SiC JFET. An inductor input terminal is connected to the drain of the first SiC JFET.

15 Claims, 6 Drawing Sheets

(56) References Cited

U.S. PATENT DOCUMENTS

| | | | | |
|---|---|---|---|---|
| 2009/0251118 A1* | 10/2009 | Omi | ................ | H02M 1/36 |
| | | | | 323/282 |
| 2011/0019450 A1* | 1/2011 | Callanan | ............ | H03K 17/0406 |
| | | | | 363/126 |
| 2011/0103107 A1* | 5/2011 | Huang | ................. | H02M 5/458 |
| | | | | 363/40 |
| 2011/0109241 A1* | 5/2011 | Kitamura | ........... | H05B 33/0818 |
| | | | | 315/291 |
| 2014/0334214 A1* | 11/2014 | Katoh | ............... | H02M 7/53803 |
| | | | | 363/132 |
| 2015/0035586 A1* | 2/2015 | Weis | ................... | H03K 17/687 |
| | | | | 327/436 |
| 2015/0070076 A1* | 3/2015 | Honea | .............. | H03K 17/08142 |
| | | | | 327/424 |
| 2015/0236087 A1* | 8/2015 | Chang | ................ | H01L 29/0619 |
| | | | | 257/339 |
| 2016/0218100 A1* | 7/2016 | Ikeda | ................. | H01L 27/0629 |

\* cited by examiner

US 10,050,620 B2

CASCODE CONNECTED SIC-JFET WITH SIC-SBD AND ENHANCEMENT DEVICE

BACKGROUND OF THE INVENTION

Silicon carbide based (SiC) switching devices promise to be a major breakthrough for high voltage applications such as high voltage power converters. SiC switching devices such as binary junction transistors (BJTs), metal oxide field effect transistors (MOSFETs), insulated-gate bipolar transistors (IGBTs), etc., offer improved breakdown voltage, thermal resistance, speed, etc., when compared to their Si based counterparts. SiC switching devices, however, need improvement. For example, the SiC based JFET is more reliable and provides better switching performance, but the SiC based JFET is depression mode device, which means it is active or on when zero potential exists between its gate and source. This makes the SiC based JFET ill-suited for use in high voltage applications. The SiC based MOSFET is an enhancement mode device, which means it is active or on when a threshold voltage Vth is applied between its gate and source. But SiC MOSFETs can suffer from poor performance of gate oxides. The short minority carrier lifetime of p-n junctions of the SiC BJT promotes switching performance, but SiC BJTs often lack sufficient current gain, $h_{FE}$.

SUMMARY OF THE INVENTION

An apparatus that includes a first device connected to an inductor. The first device includes a first silicon carbide (SiC) junction gate field-effect transistor (JFET), a first SiC schottky barrier diode (SBD) connected to a gate and a drain of the first SiC JFET, and a first silicon (Si) transistor connected to transmit current to a source of the first SiC JFET. An inductor input terminal is connected to the drain of the first SiC JFET.

BRIEF DESCRIPTION OF THE DRAWINGS

The present invention may be better understood in its numerous objects, features, and advantages made apparent to those skilled in the art by referencing the accompanying drawings.

The use of the same reference symbols in different drawings indicates similar or identical items.

DETAILED DESCRIPTION

Switching devices may take many different forms. Depletion mode and enhancement mode devices are two types. An enhancement mode MOSFET is off or inactive when a voltage (e.g., zero voltage) applied between the gate and source is below a threshold voltage Vth, and the enhancement mode MOSFET is on or active when a voltage applied between the gate and source exceeds the threshold voltage Vth. In contrast, a depletion mode JFET is typically on when zero or a negative voltage is applied between its gate and source. As a result depletion mode JFETs by themselves are typically not used in high voltage applications.

Figure 1A:
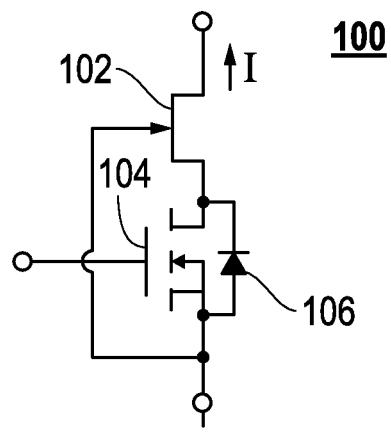
FIG. 1A is a circuit diagram illustrating an switching device.

FIG. 1A is a circuit diagram illustrating a switching device 100 that can be employed in DC-DC converters, H bridges, etc. Switching device 100 includes SiC based JFET 102 and Si based MOSFET 104. The transistors are cascade connected with the gate of JFET 102 connected to the source of MOSFET 104, and the source of JFET 102 connected to the drain of MOSFET 104. FIG. 1A also shows a p-n junction body diode 106 of MOSFET 104.

MOSFET 104 is an enhancement mode device. JFET 102 is a depletion mode device, and is turned on when the voltage between its gate and source exceeds its threshold voltage Vth (e.g., −2.5 V). Overall, switching device 100 operates as an enhancement mode device; switching device 100 is turned on when a voltage applied between the gate and source of MOSFET 104 exceeds its threshold voltage Vth, and switching device 100 turns off when zero voltage is applied between the gate and source of MOSFET 104. When MOSFET 104 is off, current I can still flow through activated body diode 106 and JFET 102. For example, with zero voltage applied between the gate and source of MOSFET 104, current I can flow when the gate to source voltage Vgs of JFET 102 is −0.8 V and the voltage across diode 106 is 0.8 V.

In addition to operating as an enhancement mode device, which is important in high voltage applications, switching device 100 provides high breakdown voltage, low thermal resistance, and other advantages. Unfortunately, switching power loss in body diode 106 in particular, can be a problem. To illustrate, FIGS. 1B-1E show a step-down DC-DC converter 108 employing the switching device 100 of FIG. 1A. DC-DC converter 108 includes high and low side switching devices 110 and 112 coupled to an inductor 114, capacitor 116, and load resistor 118 as shown. High-side and low-side switching devices 110 and 112 take form in the switching device 100 of FIG. 1A.

Step-down DC-DC converters like that shown in FIGS. 1B-1E are often used for converting high-voltage DC power into low-voltage DC power. DC-DC converter 108 generates an output voltage Vout as a function of the input voltage Vin and a duty cycle D of a high-side square wave, which drives the high-side MOSFET.

Operation of DC-DC converter 108 is controlled by complementary, non-overlapping high-side and low-side square waves having a frequency $E_{sw}$ of 50K-500K Hz, which can be generated by a pulse width modulation (PWM) circuit and respective drivers (not shown). More particularly, the MOSFET gates in switching devices 110 and 112 are driven by high-side and low-side square waves, respectively. Because the complimentary high-side and low-side square waves are non-overlapping, the high-side and low-side switching devices 110 and 112 are never on at the same time, which prevents current shoot-through from Vin to ground. The time during which the square waves are non-overlapping is known as the "dead time." During the short dead time of about 100 nsec, body diode 106 conducts current to the inductor 114 if its forwarding voltage is exceeded. However, as will be more fully described below, this can lead to reverse recovery switching loss, which can adversely affect the overall power efficiency of DC-DC converter 108.

Figure 1B:
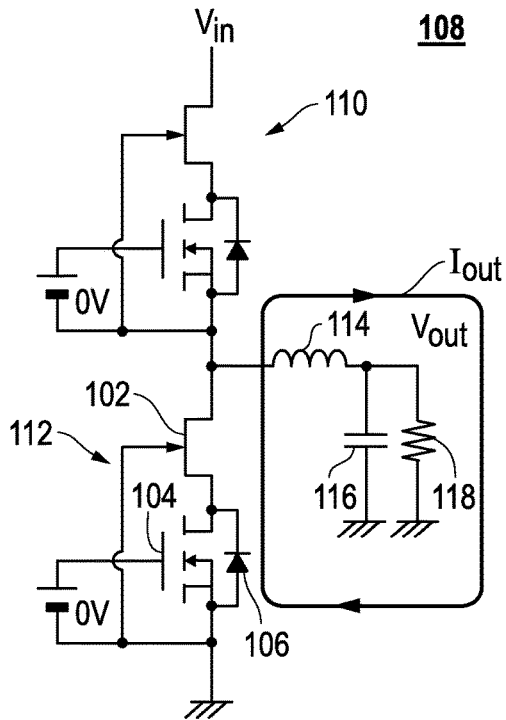
FIGS. 1B-1E are circuit diagrams of a DC-DC converter employing the switching device of FIG. 1A.
Figure 1C:
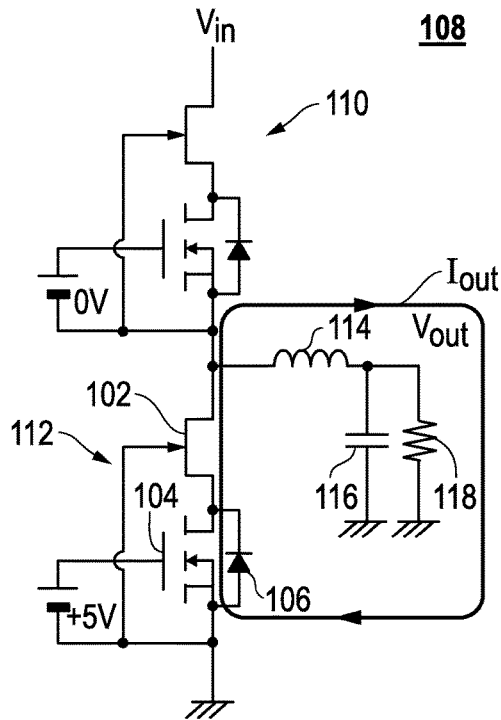
Figure 1D:
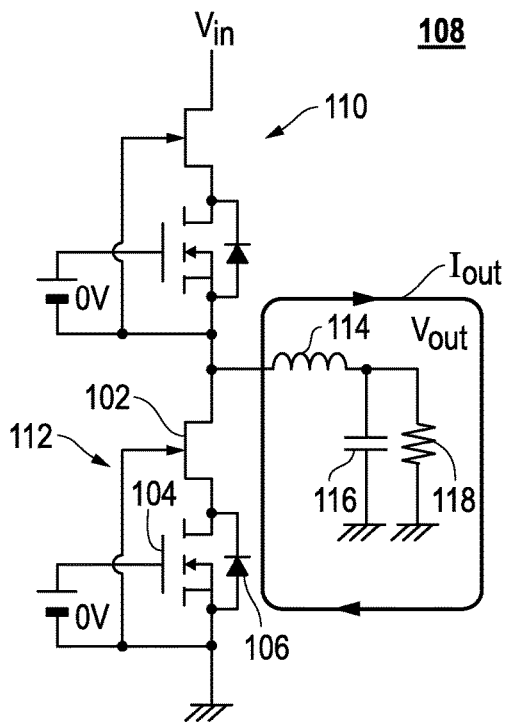

DC-DC converter 108 sequences through four states during a cycle of operation. FIGS. 1B-1E illustrate aspects of DC-DC converter 108 during these four states. FIG. 1B shows a first state in which both high-side and low-side switching devices 110 and 112 are off (i.e., zero voltage is applied between the gate and sources of the MOSFETs). Before DC-DC converter 108 enters the first state, inductor 114 has been energized with current from a prior cycle of operation. The inductance cannot interrupt the current abruptly when DC-DC converter 108 enters the first state; the inductance generates an added voltage until the body diode 106 is forward biased and conducts Iout. FIG. 1C shows the second state of the cycle of operation. In the second state, low-side switching device 112 is turned on by the low-side square wave, while high-side switching device 110 remains off. Iout flows through activated MOSFET 104 and JFET 102 as shown. Before the high-side switching device 110 is turned on in the fourth state, the low-side switching device 110 is turned off to prevent current shoot-through. FIG. 1D shows the third state in which both high-side and low-side switching devices 110 and 112 are off. Again, current flow through inductor 114 cannot abruptly change, and as a result body diode 106 is forward biased to transmit Iout. During this dead time, minority carriers are injected into and stored in the p-n junction of body diode 106. The quantity stored in the p-n junction depends on the magnitude of Iout flowing through body diode 106 during the dead time.

Figure 1E:
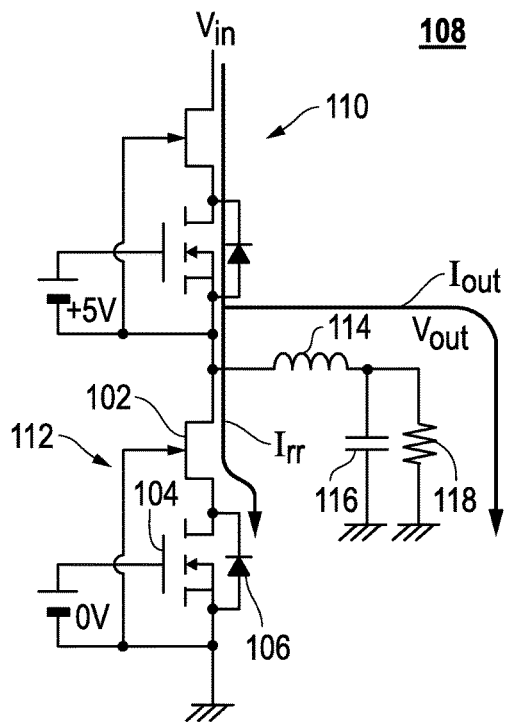

Finally high-side switching device 110 is turned on in the fourth state while low-side switching device 112 remains off as shown in FIG. 1E. Unfortunately, as the high-side switching device 110 turns on, body diode 106 is suddenly reversed biased, and a reverse recovery current Irr flows through body diode 106 until charge (i.e., reverse recovery charge Qrr) stored at its p-n junction has been depleted. A significant switching loss occurs in body diode 106 as Qrr is depleted.

Figure 2:
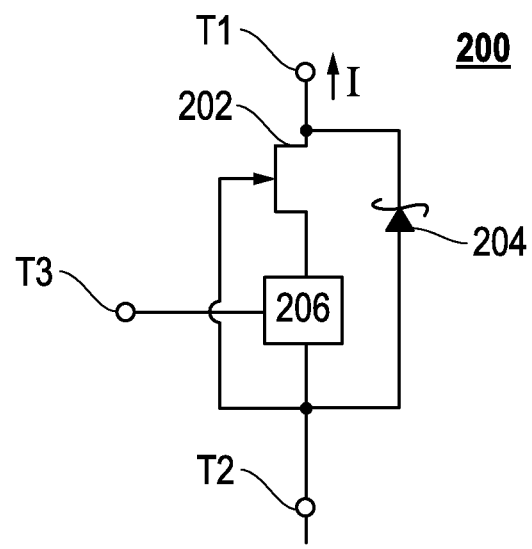
FIG. 2 is circuit diagram illustrating another switching device.

FIG. 2 illustrates another switching device 200 that can be employed in DC-DC converters, H bridges, etc., which addresses problems, including the switching loss problem described above. Device 200 includes a SiC based JFET 202 and a SiC based Schottky barrier diode (SBD) 204. The present invention will be described with JFET 202 and SBD 204 fabricated on the same SiC based die, it being understood that the present invention should not be limited thereto. Like JFET 102 shown in FIG. 1A, JFET 202 is a depression mode device. In one embodiment, JFETs 102 and 202 have the same operating characteristics. Device 200 also includes a Si based enhancement mode device 206, which may take form in a MOSFET, IGBT, BJT, etc. For purposes of explanation only, it will be presumed that enhancement mode device 206 is fabricated on a Si based die, which is separate from the SiC based die that contains JFET 202 and SBD 204.

Overall, device 200 acts as an enhancement mode device; switching device 200 is turned on when device 206 is turned on, and switching device 200 is turned off when device 206 is turned off. JFET 202 is normally on. When device 200 is on, current can freely flow from terminal T1 to T2, or vice-versa, with very little resistance. As shown in FIG. 2, the drain of JFET 202 is connected to terminal T1. The gate of JFET 202 is connected to terminal T2 and the anode of SBD 204. Finally, the cathode of SBD 104 is connected to the drain of JFET 202.

Figure 3:
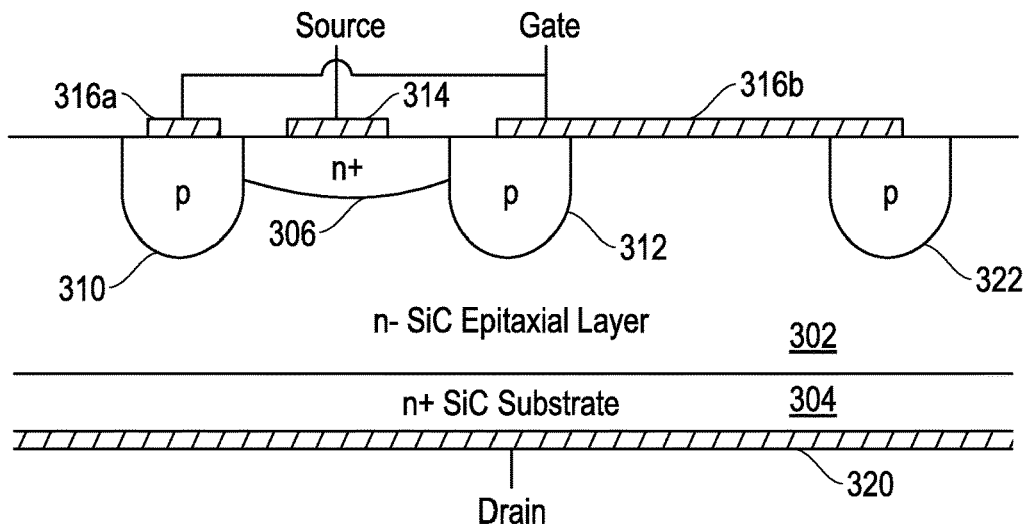
FIG. 3 illustrates a cross-sectional view of an example JFET and SBD that can be employed in the switching device of FIG. 2.

FIG. 3 illustrates a cross-sectional view of an example JFET 202 and SBD 204. An n− SiC epitaxial layer 302 is in contact with an n+ SiC substrate 304. JFET 202 includes an n+ diffusion region 306 that is positioned between p diffusion regions 310 and 312. A source terminal is connected to metal layer 314, which is in contact with n+ diffusion region 306. A gate terminal is connected to metal layers 316a and 316b. Metal layer 316a is in contact with p diffusion region 310, and metal layer 316b is in contact with p diffusion layer 312. A drain terminal is connected to metal layer 320, which is in contact with n+ SiC substrate as shown. Metal layers 316b and 320 are shared by JFET 202 and SBD 204. The junction between metal layer 316b and n-epitaxial layer 302 forms a schottky barrier of SBD 204. The anode and cathode of SBD 204 are connected to the gate and drain terminals, respectively, of JFET 202. SBD 204 also includes p diffusion region 322 that is in contact with metal layer 316b.

One important difference between p-n diodes, such as MOSFET body diodes, and SBDs is the reverse recovery time or time needed to deplete Qrr. The reverse recovery time for a p-n diode can be on the order of hundreds of nanoseconds. SBDs do not have a recovery time, as there is nothing to recover (i.e., no Qrr to deplete when switching from the forward bias state to the reverse bias state). Essentially, no reverse recovery current is needed for SBDs.

Figure 4A:
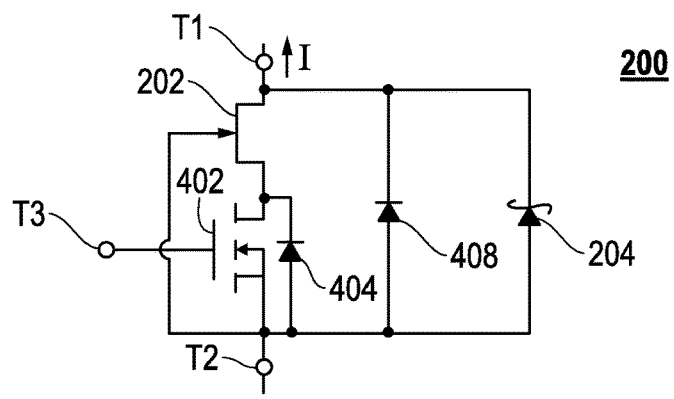
FIGS. 4A and 4B are circuit diagrams of alternative embodiments of the switching device shown in FIG. 2.
Figure 4B:
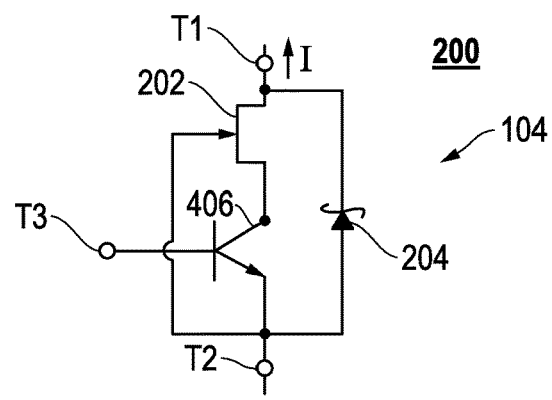

As noted, device 200 includes Si based enhancement mode device 206, which may take form in a MOSFET, IGBT, BJT, etc. With continuing reference to FIG. 2, FIGS. 4A and 4B illustrate alternative embodiments of device 206. FIG. 4A illustrates device 200 with device 206 implemented as a MOSFET 402. FIG. 4B illustrates device 200 with device 206 implemented as a BJT 406.

With continuing reference to FIG. 4A, device 200 shows the drain of MOSFET 402 connected to the source of JFET 202, and the source of MOSFET 402 coupled to the cathode of SBD 204. FIG. 4A also shows p-n junction body diode 404 of MOSFET 402, and gate to drain p-n diode 408 of JFET 202. For purposes of explanation only, MOSFET 402 is presumed identical in structure to MOSFET 104 shown in FIGS. 1A-1E. Accordingly, body diode 404 is identical to body diode 106 in this embodiment.

The devices shown in FIGS. 1A and 4A are similar. Like JFET 102, JFET 202 is a depletion mode device, which is normally on when the voltage between its gate and source exceeds its threshold voltage Vth (e.g., −2.5 V). Like MOSFET 104, MOSFET 402 is an enhancement mode device that can be turned on when a voltage between its gate and source exceeds the threshold voltage Vth. Overall, switching device 200 operates as an enhancement mode device; switching device 200 is turned on when a voltage applied between the gate and source of MOSFET 402 exceeds its threshold voltage Vth, and switching device 200 turns off when zero voltage is applied between the gate and source of MOSFET 402. When MOSFET 402 is off, current $I_{Diode}$ can flow through activated body diode 404 and JFET 202. For example, with zero voltage applied between the gate and source of MOSFET 402, current $I_{Diode}$ can flow when the gate to source voltage Vgs of JFET 202 is −0.8 V, and the voltage across diode 404 is 0.8 V. Unlike device 100, when MOSFET 402 is turned off, current $I_{SBD}$ can flow through SBD 204 provided the voltage across SBD 204 exceeds its forwarding voltage. When MOSFET 402 is turned off, current I can be distributed between current $I_{Diode}$ through body diode 404 and current $I_{SBD}$ through SBD 204. This presumes negligible current flow through p-n junction diode 408 of JFET 202.

JFET 202, SBD 204 and MOSFET 402 can be fabricated so that the forwarding voltage of SBD 204 is less than the combined voltage drops across body diode 404 and the source-drain of JFET 202. For example, JFET 202 can be fabricated so that its drain-source resistance Rds is approximately 100 mohms when turned on; SBD 204 can be fabricated to have a forwarding voltage of approximately 1.5 volts, and; MOSFET 402 can be fabricated with a forwarding voltage of 0.8 volts for body diode 404. With these parameters, $I_{Diode}=7$ amps, and total current $I=7+I_{sBD}$ when MOSFET 402 is in the off state.

As one of ordinary skill understands, current I through device 200 when turned off is distributed between forward biased diode 404 and forward biased SBD 204. In contrast, when device 100 of FIG. 1A is turned off, all current will flow through forward biased body diode 106. If both devices 100 and 200 transmit, for example, 20 amps when turned off, body diode 106 will transmit all 20 amps while body diode 404 transmits 7 amps. Presuming a very short forwarding bias state, Qrr depends on the magnitude of the forwarding current through the body diode, and the magnitude of the power lost in the body diode when it switches to the reverse bias state, depends on the magnitude of Qrr. As a result, the magnitude of power lost when the diode switches to the reverse bias state depends on the magnitude of the current during the forward bias state. Diode 106 will experience greater reverse recovery power loss when compared to the reverse recovery power loss of diode 404, presuming MOSFETs 104 and 402 are identical in structure and operated the same way. This reduction of Qrr loss can be significant to the overall efficiency of systems like DC-DC converters, H bridges, etc. Because more current flows through SBD 204, the effect of Qrr in the body diode 404 can be reduced, which in turn reduces the switching loss of device 200 when compared to the switching loss of device 100 shown within FIG. 1A.

FIGS. 5A-5D illustrate operational aspects of a DC-DC converter 500 employing device 200 shown within FIG. 4A. DC-DC converter 500 is similar to DC-DC converter 108 shown in FIGS. 1B-1E, but with low-side switching device 112 replaced by low-side switching device 502, which takes form in the switching device shown in FIG. 4A. DC-DC convertor 500 is controlled by the same high-side and low-side square waves that control DC-DC convertor 106.

Figure 5A:
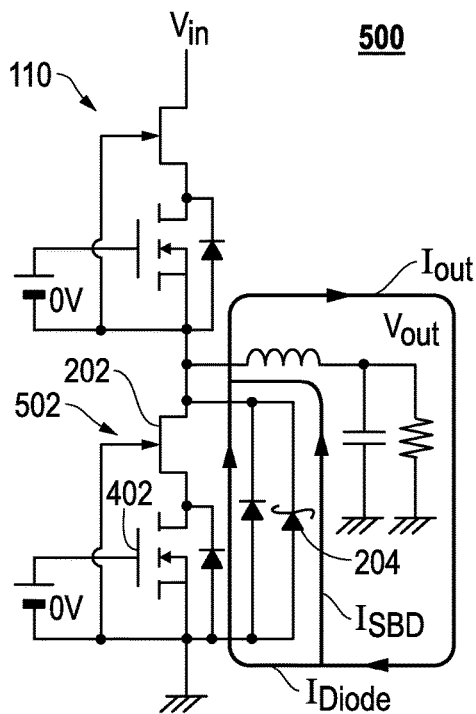
FIGS. 5A-5D are circuit diagrams of an example DC-DC converter employing the switching device of FIG. 4A.
Figure 5B:
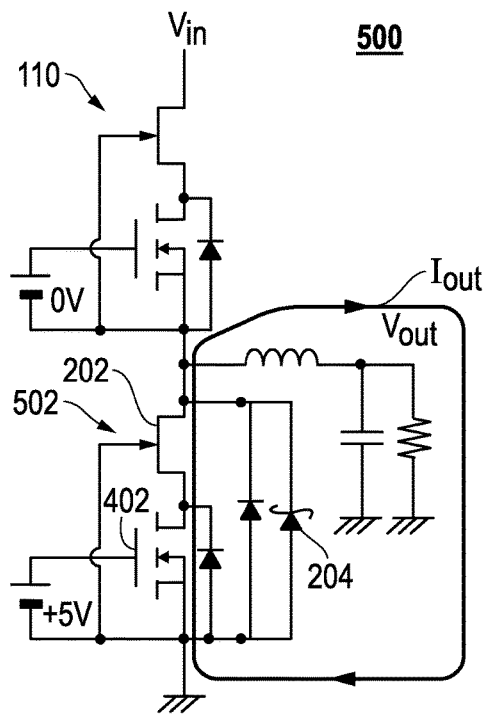
Figure 5C:
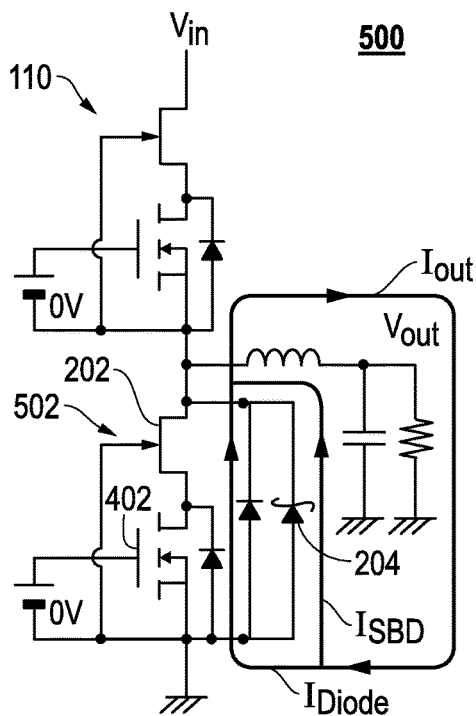
Figure 5D:
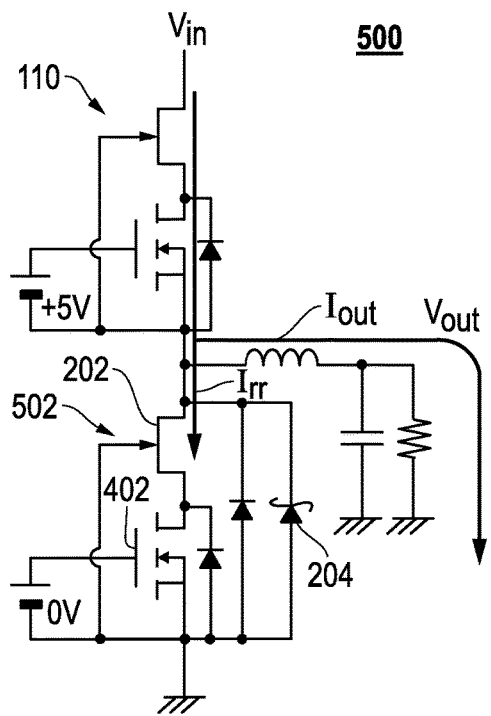

DC-DC converter 500 operates to transform high-voltage power into low-voltage power. However, Qrr losses in DC-DC convertor 500, however, should be less than Qrr losses in DC-DC converter 108 as a result of SBD 204. To illustrate, FIG. 5A shows the first state in the cycle of operation in which both high-side and low-side switching devices 110 and 502 are deactivated to prevent current shoot-through. Inductor 114 is energized with current prior to the first state. Current cannot be abruptly interrupted in the inductor. Inductor 114 generates an added voltage until body diode 404 and SBD 204 are forward biased and conducting current. FIG. 5B shows the second state of the cycle of operation, which follows the first state. In the second state, low-side switching device 502 is turned on by the low-side square wave, while high-side switching device 110 remains deactivated. Since MOSFET 402 is on, the voltage across SBD 204 is less than its forwarding threshold, and $I_{SBN}$ should be zero. Iout flows to load resistor 118 via inductor 114 and low-side switching device 502 as shown. Before the high-side switching device 110 is activated in the fourth state, the low-side switching device 502 is turned off, again to prevent current shoot-through. FIG. 5C shows the third state in which both high-side and low-side switching devices 110 and 502 are deactivated. In the third state, body diode 404 and SBD 204 are forward biased and conducting current. Finally high-side switching device 110 is activated in the fourth state as shown in FIG. 5D. At the start of this last state in the cycle, body diode 404 and SBD 204 are suddenly reversed biased, and a reverse F402 recovery current Irr flows to body diode 404 for a short time until charge (i.e., reverse recovery charge Qrr) in its junction has been depleted. The reverse current Irr ceases abruptly when Qrr is depleted. Because forwarding current through body diode 106 of FIG. 1D is greater than the forwarding current through body diode 406 in FIG. 5C, the sudden reverse biasing of body diode 106 will lead to larger switching loss when compared to the switching loss in body diode 406 when it is suddenly reversed biased. As a result, DC-DC converter 500 should be more efficient in converting DC power when compared to DC-DC converter 108.

The BJT is an important switching device used in a wide variety of applications because of their durability. BJTs are rarely affected by electrostatic discharge, and exhibit low switching noise. BJTs are less susceptible to single event effects such as single event burnout or single event gate rupture. Because of their durability, BJTs can be better suited for operation in aerospace, nuclear or other harsh environments.

A BJT typically consists of two p-n junctions producing three terminals known as the emitter, the base, and the collector. FIG. 4B illustrates device 200 of FIG. 2 implemented with a Si based BJT406. The collector of BJT 406 is connected to the source of JFET 202, and the emitter of BJT406 is coupled to the gate of JFET 202 and the anode of SBD 204. BJT406, and thus the device shown in FIG. 4B, operates as an enhancement mode device.

Figure 6:
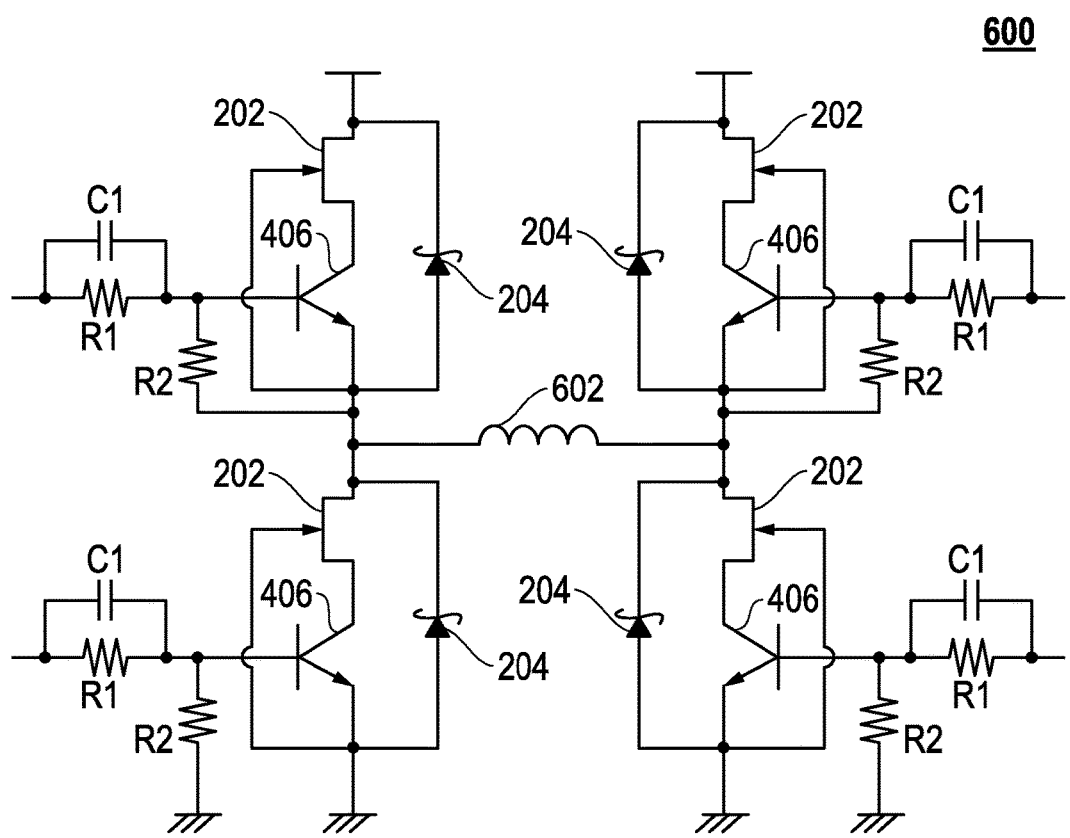
FIG. 6 is a circuit diagram of H-bridge employing the switching device shown within FIG. 4B.
Figure 7:
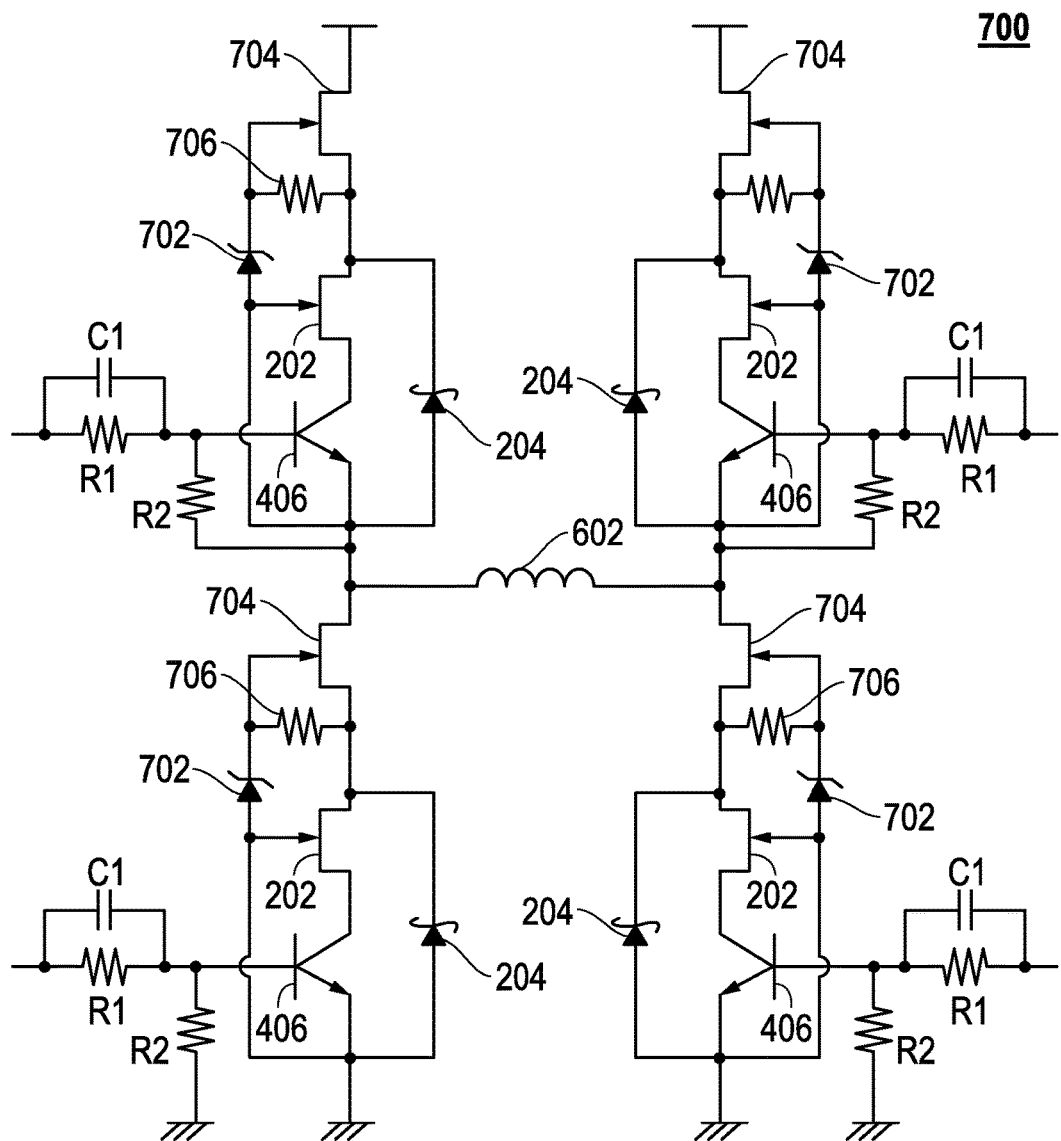
FIG. 7 is a circuit diagram of another H-bridge employing the switching device shown within FIG. 4B.

FIG. 6 illustrates an H-bridge 600 employing the switching device shown within FIG. 4B. An H-bridge is a circuit that enables a voltage to be applied across a load in either direction. These circuits are often used to allow DC motors to run forwards and backwards. H-bridge 600 employs switching devices 200 coupled to a conductive load 602 as shown. Additionally, each switching device 200 is attached to a parallel combination of resistor R1 and capacitor C1, the combination of which is coupled to the base of BJT406, and resistor R2 as shown. Another terminal of resistor R2 is coupled to the emitter directly or indirectly via a common ground connection. FIG. 7 illustrates a super high voltage H-bridge 700, which is a modification of the H-bridge 600 shown within FIG. 6. In particular, a zener diode 702 is connected to JEFT 704 and resistor 706 as shown.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:
1. An apparatus comprising:
   an inductor comprising an input terminal and an output terminal;
   a first device comprising:
      a first silicon carbide (SiC) junction gate field-effect transistor (JFET), and;
      a first SiC schottky barrier diode (SBD) connected to a gate and a drain of the first SiC JFET;
      a first silicon (Si) metal oxide field-effect transistor (MOSFET) connected to transmit current to a source of the first SiC JFET;
      wherein the inductor input terminal is connected to the drain of the first SiC JFET;

wherein the first SiC JFET and first SiC SBD are formed on a SiC die;
wherein the first Si MOSFET is formed on a Si die, and wherein the SiC die and the Si die are separate dies.

2. The apparatus of claim 1 wherein the first SiC SBD is connected to transmit current when the first Si transistor is deactivated.

3. The apparatus of claim 2 wherein the inductor input terminal is connected to the SiC SBD.

4. The apparatus of claim 3 wherein the first Si MOSFET comprises a first Si enhancement MOSFET.

5. The apparatus of claim 3:
wherein the source of the first SiC JFET is connected to a drain of the first Si MOSFET;
wherein an anode of the first SiC SBD is connected to the gate of the first SiC JFET and a source of the first Si MOSFET;
wherein a cathode of the first SiC SBD is connected to the drain of the first SiC JFET and the input terminal of the inductor.

6. The apparatus of claim 3 further comprising:
a second device comprising:
a second SiC JFET;
a second Si transistor connected to a source of the second SiC;
wherein a gate of the second SiC JFET is connected to the input terminal of the inductor.

7. The apparatus of claim 6 wherein the second device further comprises a second SiC SBD connected between a gate and a drain of the second SiC JFET.

8. The apparatus of claim 6:
wherein the second Si transistor comprises a second Si MOSFET;
wherein the cathode of first SiC SBD is connected to the gate of the second SiC JFET, a source of the second Si MOSFET, and the input terminal of the inductor.

9. The apparatus of claim 8 further comprising a circuit for generating non-overlapping, complementary first and second square waves for driving the gates of the first and second Si MOSFETs, respectively.

10. The apparatus of claim 9;
wherein the drain of the second SiC JFET is configured to be connected to a voltage source;
wherein the source of the first Si MOSFET is configured to be coupled to ground, and;
wherein the output terminal of the inductor is configured to provide current to a device.

11. An apparatus comprising:
a DC-DC converter comprising:
an inductor comprising an input terminal and an output terminal;
a first device comprising:
a first silicon carbide (SiC) junction gate field-effect transistor (JFET), and;
a first SiC schottky barrier diode (SBD) connected to a gate and a drain of the first SiC JFET;
a first silicon (Si) metal oxide field-effect transistor (MOSFET) connected to transmit current to a source of the first SiC JFET;
wherein the inductor input terminal is connected to the drain of the first SiC JFET;
wherein the first SiC JFET and first SiC SBD are formed on a SiC die;
wherein the first Si MOSFET is formed on a Si die, and wherein the SiC die and the Si die are separate dies.

12. The apparatus of claim 11 wherein the first SiC SBD is connected to transmit current when the first Si MOSFET is deactivated.

13. The apparatus of claim 12 wherein the inductor input terminal is connected to the SiC SBD.

14. An apparatus comprising:
a first silicon carbide (SiC) junction gate field-effect transistor (JFET), and;
a first SiC schottky barrier diode (SBD) connected to a gate and a drain of the first SiC JFET;
a first silicon (Si) metal oxide field-effect transistor (MOSFET) connected to transmit current to a source of the first SiC JFET;
wherein the first SiC JFET and first SiC SBD are formed on a SiC die;
wherein the first Si MOSFET is formed on a Si die, and wherein the SiC die and the Si die are separate dies.

15. The apparatus of claim 14:
wherein the source of the first SiC JFET is connected to a drain of the first Si MOSFET;
wherein an anode of the first SiC SBD is connected to the gate of the first SiC JFET and a source of the first Si MOSFET;
wherein a cathode of the first SiC SBD is connected to the drain of the first SiC JFET.

* * * * *